(12) United States Patent
Saito et al.

(10) Patent No.: US 6,522,573 B2
(45) Date of Patent: Feb. 18, 2003

(54) SOLID-STATE MAGNETIC MEMORY USING FERROMAGNETIC TUNNEL JUNCTIONS

(75) Inventors: Yoshiaki Saito, Kawasaki (JP); Kentaro Nakajima, Tokyo (JP); Minoru Amano, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/893,612

(22) Filed: Jun. 29, 2001

(65) Prior Publication Data

US 2002/0001223 A1 Jan. 3, 2002

(30) Foreign Application Priority Data

Jun. 30, 2000 (JP) ........................................ 2000-200261

(51) Int. Cl.$^7$ ............................................... G11C 11/00
(52) U.S. Cl. ...................... 365/158; 365/105; 365/173; 365/175
(58) Field of Search ................................ 365/158, 173, 365/175, 105, 129, 94

(56) References Cited

U.S. PATENT DOCUMENTS 5,640,343 A * 6/1997 Gallagher et al. .......... 365/171
5,734,605 A   3/1998 Zhu et al.
6,097,625 A   8/2000 Scheuerlein

FOREIGN PATENT DOCUMENTS

JP          10-4227          1/1998

OTHER PUBLICATIONS

Y. Saito, et al., J. Magnetic Soc. Jpn., vol. 23, No. 4–2, pp. 1269–1272, "Spin–Dependent Tunneling Through Layered Hard–Magnetic Nano–Particles", Jan. 1999 (with partial English translation).

F. Montaigne, et al., Applied Physics Letters, vol. 73, No. 19, pp. 2829–2831, "Enhanced Tunnel Magnetoresistance at High Bias Voltage in Double–Barrier Planar Junctions", Nov. 9, 1998.

J. S. Moodera, et al., J. Appl. Phys., vol. 79, No. 8, pp. 4724–4729, "Ferromagnetic–Insulator–Ferromagnetic Tunneling: Spin–Dependent Tunneling and Large Magnetoresistance in Trilayer Junctions (Invited)", Apr. 15, 1996.

L. F. Schelp, et al., Physical Review B, vol. 56, No. 10, pp. R5747–R5750, "Spin–Dependent Tunneling With Coulomb Blockade", Sep. 1, 1997.

R. Scheuerlein, et al., Proc. of ISSCC 2000, pp. 128–131, "A 10NS Read and Write Non–Volatile Memory Array Using a Magnetic Tunnel Junction and Fet Switch In Each Cell", Feb. 8, 2000.

R. C. Sousa, et al., IEEE Transactions on Magnetics, vol. 35, No. 5, pp. 2832–2834, "Vertical Integration of a Spin Dependent Tunnel Junction with an Amorphous Si Diode For MRAM Application", Sep. 1999.

R. E. Scheuerlein, Proceedings of Int'l. NonVolatile Memory Technology Conference, p. 47, "Magneto–Resistive IC Memory Limitations and Architecture Implications", May 1998.

* cited by examiner

Primary Examiner—Hoai Ho
(74) Attorney, Agent, or Firm—Oblon, Spivak, McClelland, Maier & Neustadt, P.C.

(57) ABSTRACT

According to the present invention, there is provided a solid-state magnetic memory including a semiconductor substrate, a ferromagnetic tunnel junction element facing the semiconductor substrate, first and second wirings sandwiching the ferromagnetic tunnel junction elements from both sides thereof, a third wiring facing the ferromagnetic tunnel junction element, and a diode at least part of which is formed in a surface region of the semiconductor substrate.

21 Claims, 6 Drawing Sheets

SOLID-STATE MAGNETIC MEMORY USING FERROMAGNETIC TUNNEL JUNCTIONS

CROSS-REFERENCE TO RELATED APPLICATIONS

This application is based upon and claims the benefit of priority from the prior Japanese Patent Application No. 2000-200261, filed Jun. 30, 2000, the entire contents of which are incorporated herein by reference.

BACKGROUND OF THE INVENTION

1. Field of the Invention

The present invention relates to a solid-state magnetic memory using ferromagnetic tunnel junctions and diodes.

2. Description of the Related Art

Magnetoresistance effect elements using magnetic films have been used for magnetic heads and magnetic sensors. Use of magnetoresistance effect elements as magnetic recording elements (or magnetoresistance effect memory) has also been proposed.

In recent years, a magnetoresistance effect element, or a so-called ferromagnetic tunnel junction element, has been discovered. The magnetoresistance effect element utilizes a sandwich film where a dielectric layer is inserted between two ferromagnetic layers and makes use of tunnel current flowing when a voltage is applied vertically to the film surface. With a ferromagnetic tunnel junction element (TMR element), a magnetic resistance change rate of 20% or more has been realized (J. Appl. Phys. 79, 4724 (1996)). Such a high magnetic resistance change rate was achieved by forming a thin Al layer of a thickness of 0.7 nm to 2.0 nm on a ferromagnetic electrode and then exposing its surface to oxygen glow discharge or oxygen gas to form a tunnel barrier layer made of $Al_2O_3$. This has increased the possibility that TMR elements will be applied to magnetic sensors or ferromagnetic resistance effect memory.

A ferromagnetic single tunnel junction element having a structure where an antiferromagnetic layer is provided in contact with a three-layer film of ferromagnetic layer/tunnel barrier layer/ferromagnetic layer, one ferromagnetic layer being a magnetization fixed layer, has been proposed as a typical ferromagnetic tunnel junction element (Jpn. Pat. Appln. KOKAI Publication No. 10-4227).

Furthermore, a ferromagnetic tunnel junction element where magnetic particles are distributed in a dielectric and a ferromagnetic double tunnel junction element having a structure of ferromagnetic layer/tunnel barrier layer/ferromagnetic layer/tunnel barrier layer/ferromagnetic layer (each ferromagnetic layer being continuous) have been proposed (Phys. Rev. B56 (10), R5747 (1997); Applied Magnetics Society Journal 23, 4-2, (1999); Appl. Phys. Lett., 73 (19), 2829 (1998)). Even those ferromagnetic tunnel junction elements can achieve a magnetic resistance change rate of 20% or more. Moreover, even when the applied voltage is raised to obtain the desired signal voltage, a decrease in the magnetic resistance change rate can be suppressed. As a result, the possibility that ferromagnetic tunnel junction elements will be applied to magnetic sensors or magnetic resistance effect memories is becoming stronger.

Several architectures of solid-state magnetic memory (or magnetoresistance random access memory: MRAM) using those ferromagnetic tunnel junctions have been proposed.

One of them is the architecture (CMOS+TMR architecture) that combines CMOS transistors with TMR elements as in DRAMs and uses a transistor to select the desired TMR element (U.S. Pat. No. 5,734,605). with this architecture, there is a possibility that a nonvolatile MRAM whose read and write time is as fast as 30 nanoseconds or less and which can be rewritten as many as $10^{15}$ times or more will be realized. In a case where ferromagnetic double tunnel junction elements are used in the CMOS+TMR architecture, a decrease in the magnetic resistance change rate can be suppressed even when the applied voltage is raised to obtain the desired signal voltage, producing a great signal voltage, which presents a favorable characteristic as a solid-state magnetic memory. In the CMOS+TMR architecture, however, the cell size is determined by the size of the CMOS transistor. For this reason, in the CMOS+TMR architecture, it is difficult to realize a large-capacity MRAM exceeding the capacity of a DRAM.

Furthermore, as in the FeRAM, the architecture has been proposed which constructs a memory cell of two transistors and two ferromagnetic tunnel junction elements, does writing in such a manner that the magnetization of one ferromagnetic tunnel junction element is always in reverse parallel with the magnetization of the other ferromagnetic tunnel junction element, and does reading by differential sensing (ISSCC 2000 International Meeting, February, 2000). Use of this architecture makes it unnecessary to use reference cells because reading is done by differential sensing, which makes the signal voltage as high as twice or more that of the CMOS+TMR architecture. Since in this architecture, a memory cell is composed of two transistors and two TMRs, the cell size becomes larger, which makes it impossible to realize a large-capacity MRAM.

To solve the problem of restrictions on the capacity caused by the use of the aforementioned transistors, a structure that connects diodes and ferromagnetic tunnel junction elements in series has been proposed (Proceedings of Int'l. Nonvolatile Memory Technology Conference, p.47, 1998; IEEE Trans. Mag., 35, 2832 (1999)). Since in these architectures, an a-Si diode is formed on metal wires, the formation of a large-capacity MRAM might cause a leak path in the diode, resulting in a stronger possibility that the yield of memory will be decreased seriously.

As described above, in the architecture that combines transistors with TMR elements, since the cell size is determined by the size of the transistor, the disadvantage is that it is difficult to realize a large-capacity MRAM. On the other hand, the architecture that connects diodes and ferromagnetic tunnel junctions in series has a disadvantage in that a leak path develops in an a-Si diode formed on metal wires and therefore there is a stronger possibility that the yield of memory will be decreased seriously.

BRIEF SUMMARY OF THE INVENTION

An object of the present invention is to provide a solid-state magnetic memory which enables a higher capacity, assure a high reliability, and has a high yield.

According to a first aspect of the present invention, there is provided a solid-state magnetic memory comprising a semiconductor substrate, ferromagnetic tunnel junction elements arrayed in a row direction and a column direction crossing the row direction and each comprising a magnetic recording layer, a magnetization direction of which is reversed by applying first and second magnetic fields thereto and changing a direction of the second magnetic field, a magnetization fixed layer facing the magnetic recording layer and configured to retains a magnetization direction thereof unchanged on applying the first and second magnetic fields, and a nonmagnetic layer intervening between the magnetic recording layer and the magnetization fixed layer, first wirings each extending in the column direction and arranged in the row direction, a unit consisting of one of the first wirings and one of first element groups being repeated in the row direction, each of the first element groups comprising part of the ferromagnetic tunnel junction elements arranged in the column direction, and the first wirings being configured to generate the first magnetic field by causing currents to flow in the same direction through two of the first wirings adjacent to each other, second wirings positioned apart from the first wirings, each extending in the row direction and arranged in the column direction, the second wirings facing second element groups respectively, each of the second element groups comprising part of the ferromagnetic tunnel junction elements arranged in the row direction, and the second wirings being configured to generate the second magnetic field by causing a current to flow through one of the second wirings, and diodes each formed in a surface region of the semiconductor substrate at least partially, each of the second wirings being electrically connected to one of the first wirings via one of the ferromagnetic tunnel junction elements and one of the diodes, and forward directions of the diodes being equal to directions of current flows from the second wirings to the first wirings.

According to a second aspect of the present invention, there is provided a solid-state magnetic memory comprising a semiconductor substrate, ferromagnetic tunnel junction elements arrayed in a row direction and a column direction crossing the row direction and each comprising a magnetic recording layer, a magnetization direction of which is reversed by applying first and second magnetic fields thereto and changing a direction of the second magnetic field, a magnetization fixed layer facing the magnetic recording layer and configured to retain a magnetization direction thereof unchanged on applying the first and second magnetic fields, and a nonmagnetic layer intervening between the magnetic recording layer and the magnetization fixed layer, first wirings each extending in the column direction and arranged in the row direction, a unit consisting of two of the first wirings, two of first element groups positioned between the two of the first wirings, and one of the second wirings positioned between the two of the first element groups being repeated in the row direction, each of the first element groups comprising part of the ferromagnetic tunnel junction elements arranged in the column direction, and the first and second wirings being configured to generate the first magnetic field by causing currents to flow in the same direction through one of the first wirings and one of the second wirings adjacent to each other, third wirings positioned apart from the first and second wirings, each extending in the row direction and arranged in the column direction, the third wirings facing second element groups respectively, each of the second element groups comprising part of the ferromagnetic tunnel junction elements arranged in the row direction, and the third wirings being configured to generate the second magnetic field by causing a current to flow one of the third wirings, and diodes each formed in a surface region of the semiconductor substrate at least partially, each of the third wirings being electrically connected to one of the first wirings via one of the ferromagnetic tunnel junction elements and one of the diodes, the second wirings being electrically insulated from the first and third wirings, and forward directions of the diodes being equal to directions of current flows from the third wirings to the first wirings.

According to a third aspect of the present invention, there is provided a solid-state magnetic memory comprising, a semiconductor substrate, a ferromagnetic tunnel junction element facing the semiconductor substrate and comprising a magnetic recording layer, a magnetization direction of which is reversed by applying first and second magnetic fields thereto and changing a direction of the second magnetic field, a magnetization fixed layer facing the magnetic recording layer and configured to retain a magnetization direction thereof unchanged on applying the first and second magnetic fields, and a nonmagnetic layer intervening between the magnetic recording layer and the magnetization fixed layer, a first wiring and a second wiring, the first and second wirings sandwiching the ferromagnetic tunnel junction element from both sides thereof, and the first and second wirings being configured to generate the first magnetic field by causing currents to flow in the same direction through the first and second wirings, a third wiring positioned apart from the first and second wirings, extending in the row direction and facing the ferromagnetic tunnel junction element, the third wiring being configured to generate the second magnetic field by causing a current to flow through the third wiring, and a diode formed in a surface region of the semiconductor substrate at least partially, the third wiring being electrically connected to the first wiring via the ferromagnetic tunnel junction element and the diode, and a forward direction of the diode being equal to a direction of current flow from the third wiring to the first wiring.

According to a fourth aspect of the present invention, there is provided a solid-state magnetic memory comprising a substrate, ferromagnetic tunnel junction elements arrayed in a row direction and a column direction crossing the row direction and each comprising a magnetic recording layer, a magnetization direction of which is reversed by applying first and second magnetic fields thereto and changing a direction of the second magnetic field, a magnetization fixed layer facing the magnetic recording layer and configured to retains a magnetization direction thereof unchanged on applying the first and second magnetic fields, and a nonmagnetic layer intervening between the magnetic recording layer and the magnetization fixed layer, first wirings each extending in the column direction and arranged in the row direction, a unit consisting of one of the first wirings and one of first element groups being repeated in the row direction, each of the first element groups comprising part of the ferromagnetic tunnel junction elements arranged in the column direction, and the first wirings being configured to generate the first magnetic field by causing currents to flow in the same direction through two of the first wirings adjacent to each other, second wirings positioned apart from the first wirings, each extending in the row direction and arranged in the column direction, the second wirings facing second element groups respectively, each of the second element groups comprising part of the ferromagnetic tunnel junction elements arranged in the row direction, the magnetic recording layers being located between the first wirings and the second wirings, and the second wirings being configured to generate the second magnetic field by causing a current to flow through one of the second wirings, and diodes each provided to the substrate, each of the second wirings being electrically connected to one of the first wirings via one of the ferromagnetic tunnel junction elements and one of the diodes, forward directions of the diodes being equal to directions of current flows from the second wirings to the first wirings, and the first wirings being located between the diodes and the second wirings.

According to a fifth aspect of the present invention, there is provided a solid-state magnetic memory comprising a substrate, ferromagnetic tunnel junction elements arrayed in a row direction and a column direction crossing the row direction and each comprising a magnetic recording layer, a magnetization direction of which is reversed by applying first and second magnetic fields thereto and changing a direction of the second magnetic field, a magnetization fixed layer facing the magnetic recording layer and configured to retain a magnetization direction thereof unchanged on applying the first and second magnetic fields, and a nonmagnetic layer intervening between the magnetic recording layer and the magnetization fixed layer, first and second wirings each extending in the column direction and arranged in the row direction, a unit consisting of two of the first wirings, two of first element groups positioned between the two of the first wirings, and one of the second wirings positioned between the two of the first element groups being repeated in the row direction, each of the first element groups comprising part of the ferromagnetic tunnel junction elements arranged in the column direction, and the first and second wirings being configured to generate the first magnetic field by causing currents to flow in the same direction through one of the first wirings and one of the second wirings adjacent to each other, third wirings positioned apart from the first and second wirings, each extending in the row direction and arranged in the column direction, the third wirings facing second element groups respectively, each of the second element groups comprising part of the ferromagnetic tunnel junction elements arranged in the row direction, the magnetic recording layers being located between the first and second wirings and the third wirings, and the third wirings being configured to generate the second magnetic field by causing a current to flow one of the third wirings, and diodes each provided to the substrate, each of the third wirings being electrically connected to one of the first wirings via one of the ferromagnetic tunnel junction elements and one of the diodes, the second wirings being electrically insulated from the first and third wirings, forward directions of the diodes being equal to directions of current flows from the third wirings to the first wirings, and the first and second wirings being located between the diodes and the third wirings.

According to a sixth aspect of the present invention, there is provided a solid-state magnetic memory comprising a substrate, a ferromagnetic tunnel junction element facing the substrate and comprising a magnetic recording layer, a magnetization direction of which is reversed by applying first and second magnetic fields thereto and changing a direction of the second magnetic field, a magnetization fixed layer facing the magnetic recording layer and configured to retain a magnetization direction thereof unchanged on applying the first and second magnetic fields, and a nonmagnetic layer intervening between the magnetic recording layer and the magnetization fixed layer, a first wiring and a second wiring, the first and second wirings sandwiching the ferromagnetic tunnel junction element from both sides thereof, and the first and second wirings being configured to generate the first magnetic field by causing currents to flow in the same direction through the first and second wirings, a third wiring positioned apart from the first and second wirings, extending in the row direction and facing the ferromagnetic tunnel junction element, the magnetic recording layer being located between the first and second wirings, and the third wiring being configured to generate the second magnetic field by causing a current to flow through the third wiring, and a diode provided to the substrate, the third wiring being electrically connected to the first wiring via the ferromagnetic tunnel junction element and the diode, a forward direction of the diode being equal to a direction of current flow from the third wiring to the first wiring, and the first and second wirings being located between the diode and the third wiring.

In the first to sixth aspects of the present invention, for example, either a monocrystalline silicon substrate or an SOI substrate may be used as the substrate. In the fourth to sixth aspects of the present invention, various substrate such as a semiconductor substrate and an insulating substrate may be used as the substrate.

In the first to sixth aspects of the present invention, the semiconductor substrate may comprise a trench insulating layer therein, the trench insulating layer electrically insulating the diodes from each other.

The solid-state magnetic memory in each of the first to sixth aspects of the present invention may further comprise a sensing circuit configured to differentially sense either a potential difference or a load voltage between two of the ferromagnetic tunnel junction elements.

In the first and forth aspects of the present invention, the first wirings may be located between the diodes and the second wirings and the ferromagnetic tunnel junction elements be located between the first wirings and the second wirings.

In the second, third, fifth, and sixth aspects of the present invention, the first and second wirings may be located between the diodes and the third wirings and the ferromagnetic tunnel junction elements be located between the first and second wirings and the third wirings.

In the first to sixth aspects of the present invention, each of the diodes may be a p-n junction diode having a p-type region and an n-type region both formed in the surface region of the substrate. In this case, the ferromagnetic tunnel junction elements may face the p-type regions. Furthermore, the first wirings may face the n-type regions.

In the first to sixth aspects of the present invention, the magnetization direction of the magnetic recording layer may be reversed by applying the first and second magnetic fields thereto and changing a direction of the second magnetic field. Alternatively, the magnetization direction of the magnetic recording layer may be reversed by applying the first and second magnetic fields thereto and changing a direction of the first magnetic field.

DETAILED DESCRIPTION OF THE INVENTION

Figure 1:
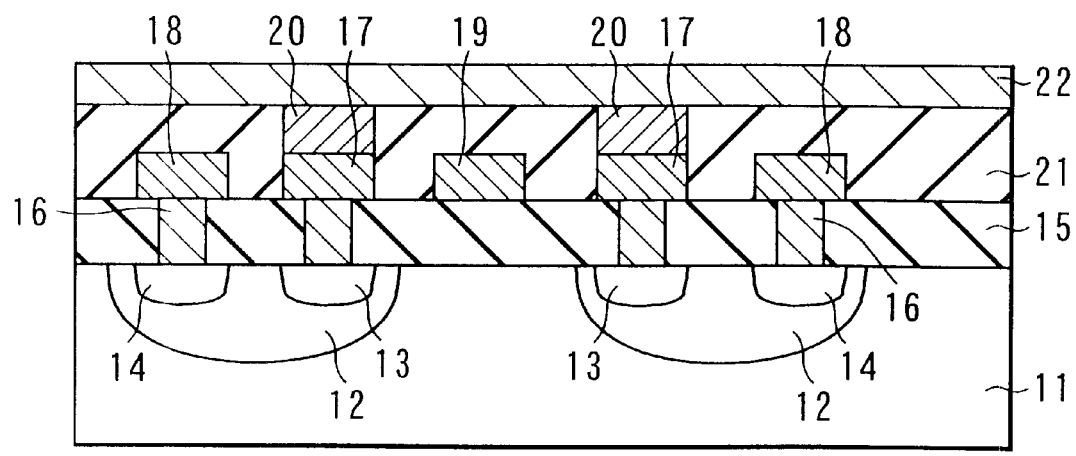
FIG. 1 is a sectional view schematically showing a solid-state magnetic memory according to a first embodiment of the present invention.

The present invention will now be described in detail with reference to the accompanying drawings. Throughout the drawings, the same or similar constituent elements are denoted by the same reference numerals so as to avoid an overlapping description.

FIG. 1 is a sectional view schematically showing a solid-state magnetic memory according to a first embodiment of the present invention. In the figure, two memory cells are shown.

The solid-state magnetic memory of FIG. 1 has a p-type monocrystalline Si substrate 11 as a semiconductor substrate. In the surface region of the Si substrate 11, an n-well 12 is formed in each cell. In each n-well 12, a p$^+$ diffused layer 13 and an n$^+$ diffused layer 14 are formed. A p-n junction diode is constituted by the p+ diffused layer 13 and n-well 12.

On the Si substrate 11, a first insulating layer 15 is formed. In the first insulating layer 15, contact holes are made in such a manner that they correspond to the p$^+$ diffused layers 13 and n$^+$ diffused layers 14. The contact holes are filled with contact metal 16. On the contact metal 16 connected to the p$^+$ diffused layer 13, a contact metal 17 and a ferromagnetic tunnel junction element (TMR element) 20 are formed. In this way, the TMR element 20 is electrically connected to one end of the diode. As explained later, the TMR element 20 includes two ferromagnetic layers stacked in such a manner that they sandwich at least a nonmagnetic layer, such as a tunnel barrier layer, between them.

First word lines 18 and second word lines 19 extend in parallel with each other in such a manner that the contact metals 17 and TMR elements 20 are flanked by the first and second word lines 18 and 19. The first word line 18 is formed on the contact metal 16 connected to the n$^+$ diffused layer 14 and is electrically connected to the other end of the diode. The second word line 19 is formed on the first insulating layer 15 and is electrically insulated from the diode. In FIG. 1, the second word line 19 is shared by the right-side memory cell and the left-side memory cell. A second insulating layer (interlayer insulating layer) 21 is formed among a set of the contact metal 17 and TMR element 20, the first word line 18, and the second word line 19. The top surface of the TMR element 20 is exposed from the second insulating layer 21. On the second insulating layer 21, a bit line 22 electrically connected to the TMR element 20 is formed. The bit line 22 extends in the direction perpendicular to the word line 18 and second word line 19.

Figure 2:
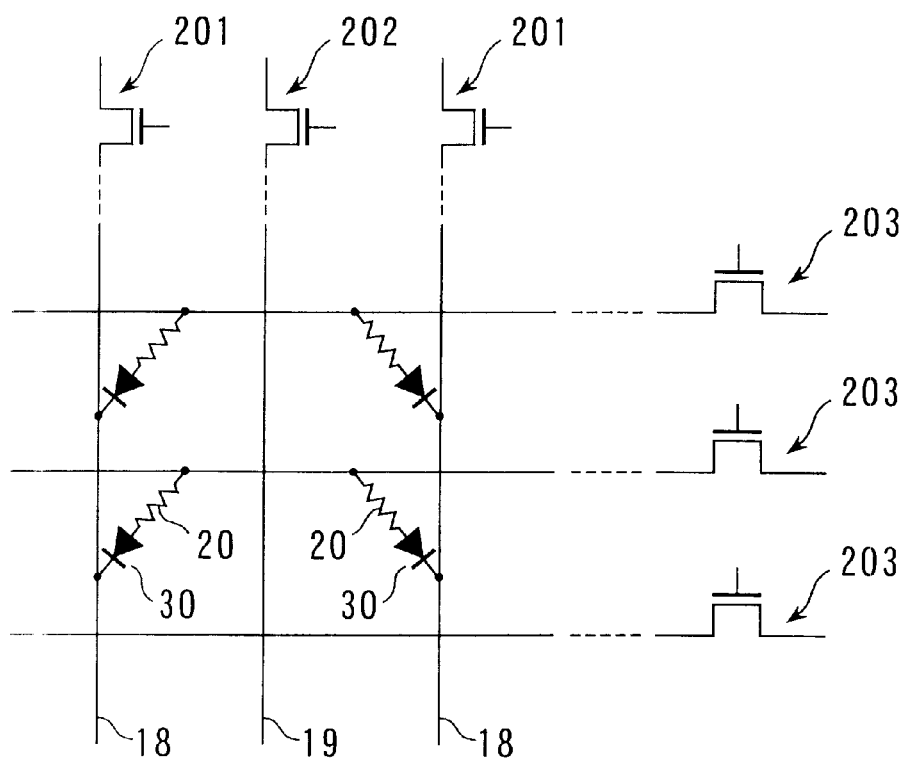
FIG. 2 is a view showing an example of an equivalent circuit for the memory of FIG. 1.

FIG. 2 is a view showing an example of an equivalent circuit for the memory of FIG. 1. As shown in the figure, memory cells, each including a TMR element 20 and a diode 30, are arranged in the row direction and the column direction in array form, thereby constituting a memory cell array. In the peripheral section of the memory cell array, a transistor 201 is connected to each first word line 18, a transistor 202 is connected to each second word line 19, and a transistor 203 is connected to each bit line 22. These transistors are connected to sense amplifiers (not shown) in a one-to-one correspondence. Each transistor controls the switching of the corresponding sense amplifier, thereby causing current to flow according to the direction of rectification of the diode.

Referring to FIGS. 3A to 3D and FIGS. 4 and 5, a method of writing information into a magnetic memory according to the first embodiment and a method of reading the information stored in the memory will be explained.

Figure 4:
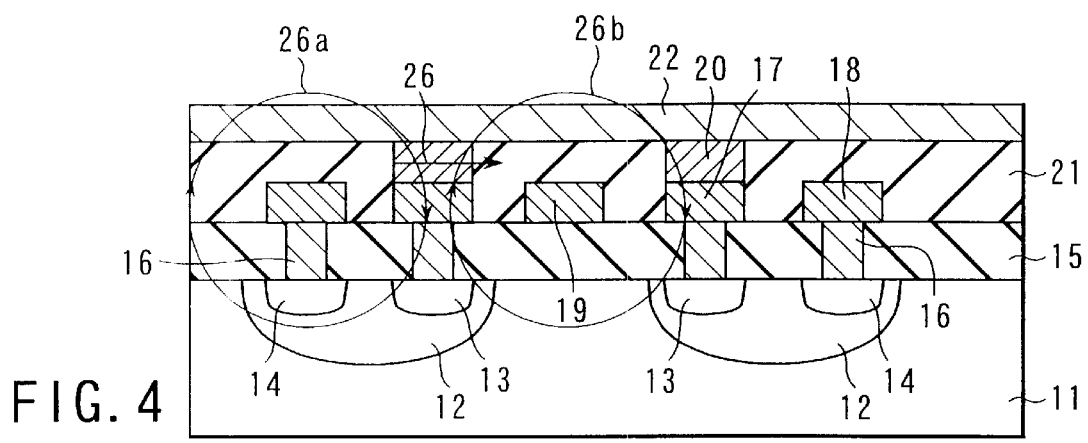
FIG. 4 is a sectional view schematically showing a current magnetic field which is to be applied to the TMR element when information is written into the memory of FIG. 1.
Figure 5:
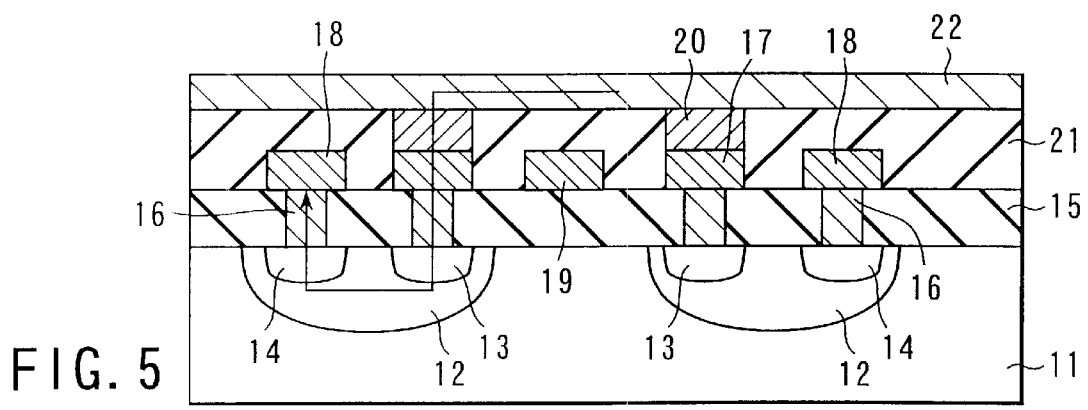
FIG. 5 is a sectional view schematically showing a current caused to flow when the information written in the memory of FIG. 1 is read.

FIGS. 3A to 3D are views schematically showing the change in the magnetization direction of a TMR element 20 occurring when information is written into the memory of FIG. 1. FIG. 4 is a sectional view schematically showing a current magnetic field caused to act on a TMR element when information is written into the memory of FIG. 1. FIG. 5 is a sectional view schematically showing a current caused to flow when the information written in the memory of FIG. 1 is read.

In each of FIGS. 3A to 3D, the memory of FIG. 1 is viewed from the bit line 22 side and portions of the bit lines are cut away in order to promote a better understanding. Note that, in the TMR element 20, two ferromagnetic layers are stacked in such a manner that they sandwich a nonmagnetic layer, such as a tunnel barrier layer, one of the ferromagnetic layers is a pin layer (or magnetization fixed layer) with fixed magnetization and the other of the ferromagnetic layers is a free layer (or magnetic recording layer) whose magnetization is reversed according to an external magnetic field. In FIGS. 3A to 3D, each arrow whose axis is a broken line represents a magnetization direction of the pin layer, each short arrow whose axis is a solid line represents a magnetization direction of the free layer, and each long arrow represents a direction of current flow. In the explanation below, information will be recorded into the memory cell surrounded by a broken line.

Figure 3A:
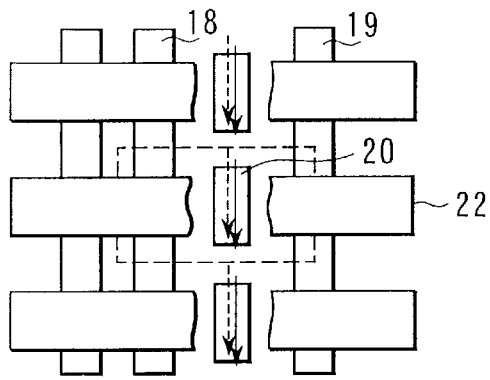
FIGS. 3A to 3D are views schematically showing the change of the magnetization direction of a TMR element occurring when information is written into the memory of FIG. 1, respectively.
Figure 3B:
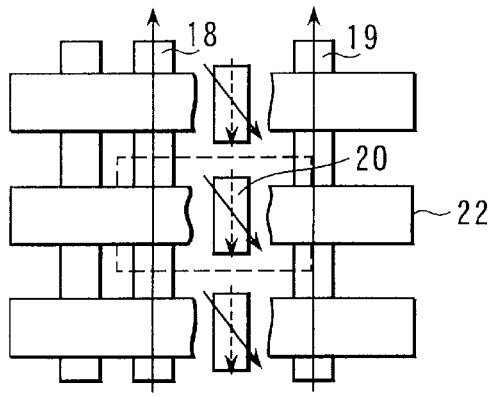

FIG. 3A shows the TMR element 20 in which no information is recorded. At this time, the magnetization of one ferromagnetic layer and that of the other ferromagnetic layer are in parallel with each other and point to the same direction. As shown in FIG. 3B, when a current pulse is applied to the first word line 18 and second word line 19 arranged on both sides of the central TMR element 20, a current magnetic field 26a is generated around the first word line 18 and a current magnetic field 26b is generated around the second word line 19 as shown in FIG. 4. The current magnetic fields 26a, 26b form a composite magnetic field. The composite magnetic field in the direction indicated by reference numeral 26 acts on the TMR element 20. Consequently, the composite magnetic field 26 inclines the magnetization of the fee layer as shown in FIG. 3B between the word lines 18 and 19 to which the current pulse has been applied.

Since the diode is connected in the forward direction with respect to the current flowing from the TMR element 20 to the first word line 18, the current caused to flow through the first word line 18 hardly leaks to the TMR element 20. To make the wiring capacitance of the first word line 18 equal to that of the second word line 19, it is desirable that their shapes and widths should be made equal.

The direction of the composite magnetic field is almost parallel to the film surface in the region between the word lines 18, 19 to which the current pulse has been applied and is almost perpendicular to the film surface in the remaining region. As a result, in the memory cells excluding those located between the word lines 18, 19 to which the current pulse has been applied, the magnetization of the free layer does not incline because of a demagnetizing field.

Figure 3C:
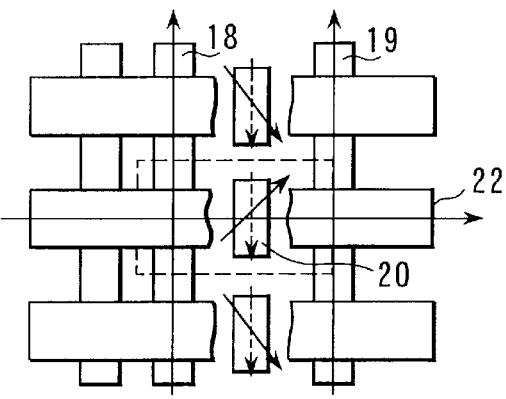

In this state, a current pulse is caused to flow to the bit line 22 that faces the memory cell surrounded by the broken line as shown in FIG. 3C. The current magnetic field produced by the bit line 22 acts on the memory cell surrounded by the broken line in the direction almost parallel to the film surface, whereas it acts on the memory cells other than that surrounded by the broken line in the direction almost perpendicular to the film surface. Consequently, only in the memory cell surrounded by the broken line, the magnetization of the free layer points to the top right.

Figure 3D:
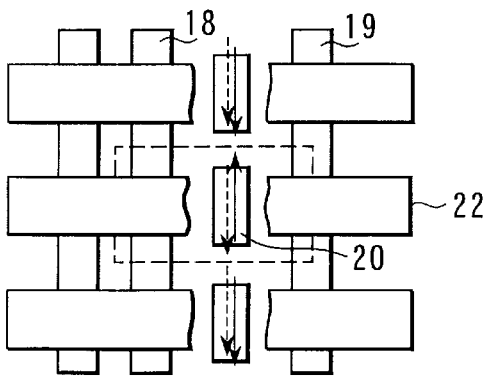

Thereafter, as the current magnetic field produced by the first word line 18, second word line 19, and bit line 22 disappears, the magnetization of the free layer points upward in the memory cell surrounded by the broken line as shown in FIG. 3D, whereas it returns to the original state in the memory cells other than that surrounded by the broken line. In this way, the magnetization of the free layer can be reversed in only the memory cell surrounded by the broken line. That is, the magnetization of the two ferromagnetic layers is brought into reverse parallel.

In a read operation, current is caused to flow from the bit line 22 through the TMR element 20 and diode to the first word line 18 as shown in FIG. 5. When the magnetization of the two ferromagnetic layers is in reverse parallel, the TMR element 20 has a high resistance (which corresponds to, for example, "0"). When the magnetization of the two ferromagnetic layers is in parallel, the TMR element 20 has a low resistance (which corresponds to, for example, "1"). Therefore, sensing the output from the first word line 18 enables the information recorded in the memory cell to be read.

With the magnetic memory according to the first embodiment, reading and writing can be done using the first word line 18 and second word line 19 provided so as to sandwich the TMR element 20 between them and the bit line 22 crossing at right angles with the word lines 18, 19. Therefore, according to the first embodiment, the number of wires at the surface is reduced as compared with a case where transistors are used as in the conventional CMOS+ TMR architecture, which enables a high packing density.

Next, a second embodiment of the present invention will be explained.

Figure 6:
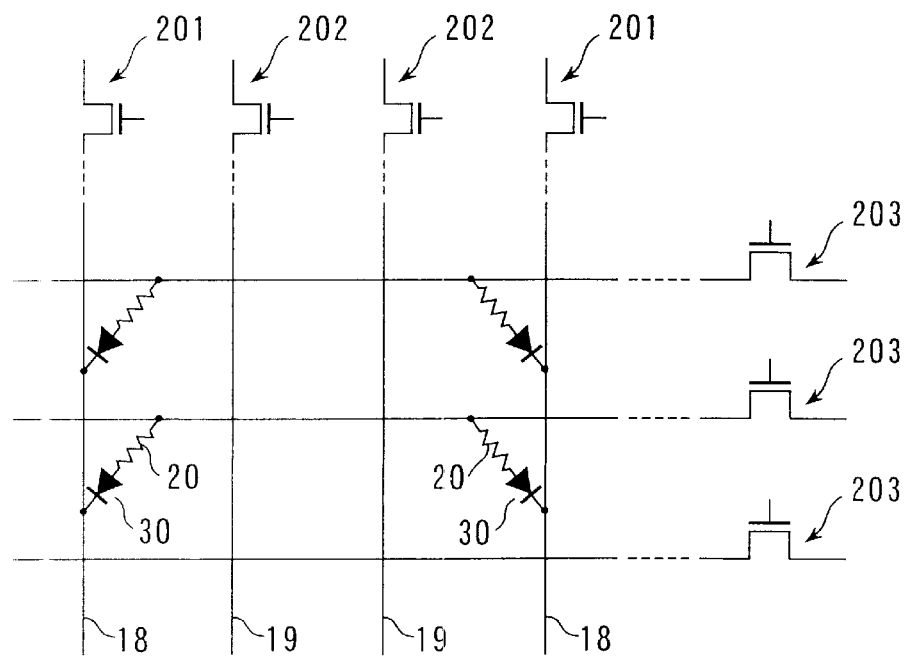
FIG. 6 is a view showing an example of an equivalent circuit for a solid-state magnetic memory according to a second embodiment of the present invention.

FIG. 6 shows an example of an equivalent circuit for a solid-state magnetic memory according to a second embodiment of the present invention. In the first embodiment, the second word line 19 is shared by two memory cells as shown in FIG. 2. In contrast, the second word line 19 is provided for each memory cell as shown in FIG. 6 in the second embodiment. Even when the number of second word lines 2 is increased, a high packing density can be achieved sufficiently, since the number of wires at the surface is smaller than that in the conventional CMOS+TMR architecture.

Hereinafter, a third embodiment of the present invention will be explained.

Figure 7:
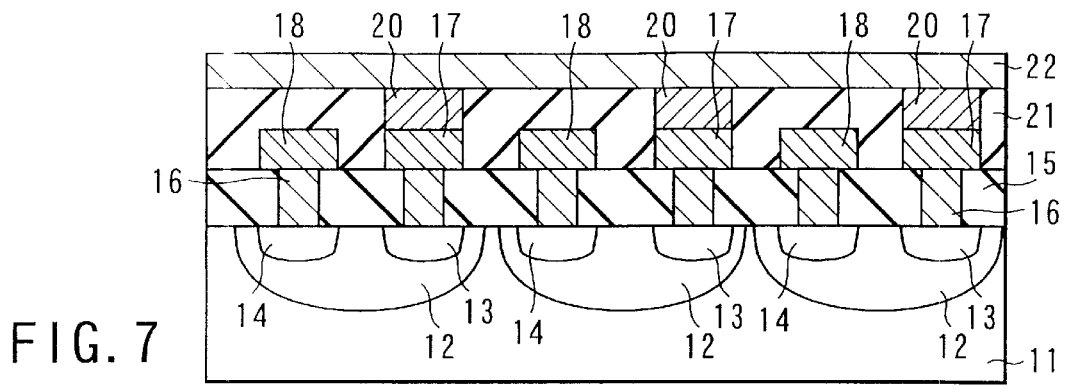
FIG. 7 is a sectional view schematically showing a solid-state magnetic memory according to a third embodiment of the present invention.
Figure 8:
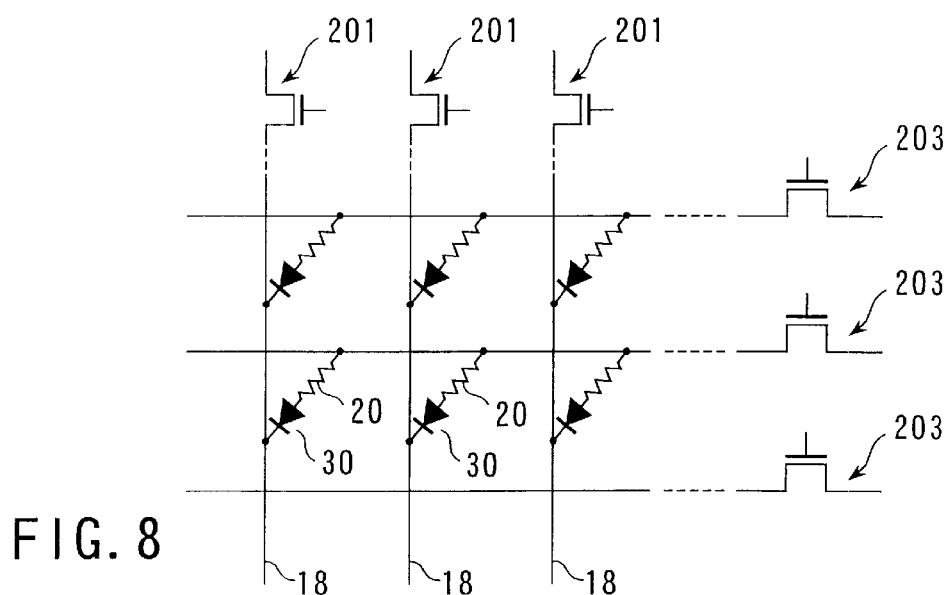
FIG. 8 is a view showing an example of an equivalent circuit for the memory of FIG. 7.

FIG. 7 is a schematic sectional view of a solid-state magnetic memory according to a third embodiment of the present invention. FIG. 8 shows an example of an equivalent circuit for the memory shown in FIG. 7.

As described above, in the first and second embodiments, information is written into a memory cell by applying a current pulse in the same direction to the first word line 18 and second word line 19 adjacent to each other and at the same time applying a current pulse to the bit line 22. In contrast, in the third embodiment, information is written into a memory cell by applying a current pulse in the same direction to two adjacent word lines 18 and at the same time applying a current pulse to the bit line 22. Specifically, with the third embodiment, there is no need to provide second word lines 19 as shown in FIGS. 7 and 8. Therefore, in the third embodiment, the number of wires is decreased more than in the first and second embodiments, which enables a much higher packing density.

In the magnetic memory in each of the first to third embodiments, diodes are formed in a Si single crystal. Such diodes have fewer leak paths and a higher reliability than a-Si diodes conventionally used. Therefore, according to the first to third embodiments, a highly reliable solid-state magnetic memory with a high yield is realized. Diodes in a Si single crystal can be produced easily by ion-implanting impurity atoms of group V, such as phosphorus, arsenic, or antimony, to form n-type regions and further ion-implanting impurity atoms of group III, such as boron, to form p-type regions. In addition to p-n junction diodes, MOS diodes or GCDs may be used as the diodes.

Figure 9:
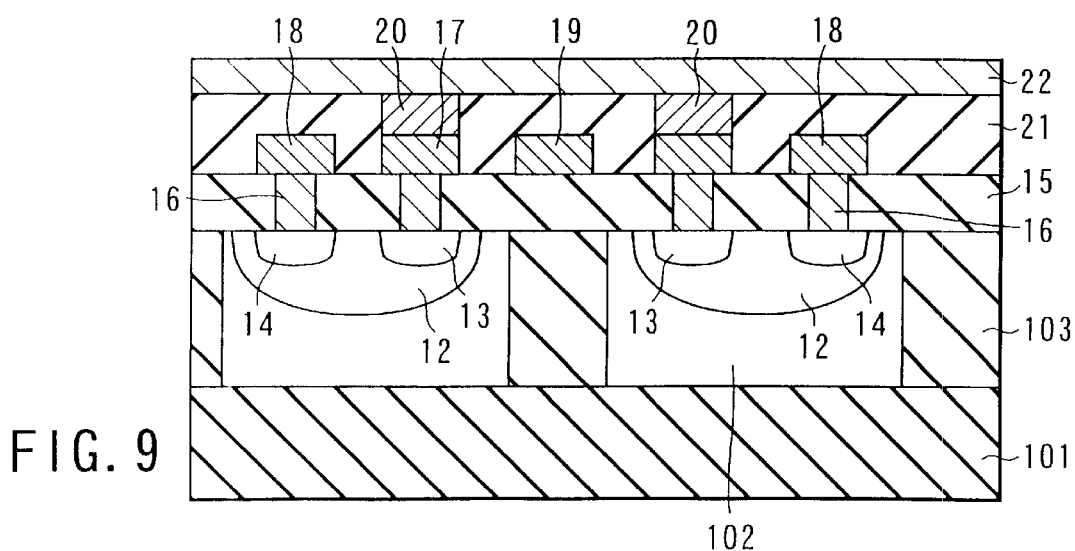
FIG. 9 is a sectional view showing an example of using an SOI substrate for the memory of FIG. 1.

Although in the first to third embodiments, a substrate other than a silicon monocrystalline substrate may be used as the semiconductor substrate 11, it is desirable to use a silicon monocrystalline substrate from the viewpoint of the facility for forming diodes as described above. Furthermore, it is more desirable to use an SOI (Silicon on Insulator) substrate where a silicon layer 102 is formed on an insulating substrate 101 as shown in FIG. 9. When an SOI substrate is used and a memory cell including a diode and a TMR element 20 is isolated by a trench insulating layer 103 from another memory cell, thereby insulating memory cells from one another, which eliminates a leak between memory cells completely. As a result, a very high reliability can be realized.

The ferromagnetic tunnel junction element 20 used in the first to third embodiments has only to have at least one tunnel barrier layer and at least two ferromagnetic layers (magnetic recording layer and magnetization fixed layer) stacked so as to sandwich the tunnel barrier between them. Therefore, the ferromagnetic tunnel junction element 20 may take the form of any of a ferromagnetic single tunnel junction, a ferromagnetic double tunnel junction, and a triple or more multiple ferromagnetic tunnel junction.

It is desirable that the ferromagnetic layers used as the magnetic recording layers and magnetization pinned layers should have a uniaxial anisotropy at the film surface. It is particularly desirable that the ferromagnetic layers used as the magnetization pinned layers should have a unidirectional anisotropy. To fix the magnetization of the magnetization pinned layer in one direction, for example, antiferromagnetic layer is provided adjacent to the ferromagnetic layer.

Any magnetic materials whose spin polarized factor is large may be used as the ferromagnetic layers. They include Fe, Co, Ni, alloys of these metals, magnetite with a large spin polarizability, oxide, such as $CrO_2$ or $RXMnO_{3-y}$ (R: rare earth elements, X: Ca, Ba, Sr), Heuslar alloy, such as NiMnSb or PtMnSb. As long as ferromagnetism is not lost, a minute amount of nonmagnetic material, such as Ag, Cu, Au, Al, Mg, Si, Bi, Ta, B, C, O, N, Pd, Pt, Zr, Ir, W, Mo, or Nb, may be added to those magnetic materials. The thickness of the ferromagnetic layer has to be made thick to the extent that it does not become super-paramagnetic. The thickness of the ferromagnetic layer is favorably 0.1 nm or more, more favorably 0.4 nm or more. Moreover, the thickness of the ferromagnetic layer is favorably 100 nm or less.

The materials for antiferromagnetic layers include Fe—Mn, Pt—Mn, Pt—Cr—Mn, Ni—Mn, Ir—Mn, NiO, and $Fe_2O_3$.

The ferromagnetic layer may have a single layer structure or a stacked layer structure. For instance, the ferromagnetic layer used as the magnetization pinned layer may be a three-layer film composed of a ferromagnetic layer, a nonmagnetic layer, and a ferromagnetic layer in this order. When the magnetization pinned layer is composed of a three-layer film of ferromagnetic layer/nonmagnetic layer/ ferromagnetic layer, it is desirable that the antiferromagnetic interaction should act between layers via the nonmagnetic layer. Specifically, when an antiferromagnetic layer is provided in contact with a three-layer film of Co(Co—Fe)/Ru/ Co(Co—Fe) or Co(Co—Fe)/Ir/Co(Co—Fe), the magnetization of the magnetization pinned layer is fixed strongly, which makes this structure less liable to be affected by the current magnetic field.

Furthermore, the ferromagnetic layer used as the magnetic recording layer may be, for example, a two-layer film of soft ferromagnetic layer/ferromagnetic layer, a three-layer film of ferromagnetic layer/soft ferromagnetic layer/ ferromagnetic layer, or a three-layer film of ferromagnetic layer/nonmagnetic layer/ferromagnetic layer. When the magnetic recording layer is composed of a three-layer film of ferromagnetic layer/nonmagnetic layer/ferromagnetic layer and the antiferromagnetic interaction is acting between layers via the nonmagnetic layer, the magnetic flux closes within the three-layer film, which suppresses an increase in the switching magnetic field caused by the magnetic poles. Thus, even when the memory cell width is on the order of submicron, the nonmagnetic field prevents the power consumption of the current magnetic field from increasing, which is a favorable effect. In this structure, of the three-layer film of ferromagnetic layer/nonmagnetic layer/ ferromagnetic layer, it is desirable to use a softer ferromagnetic layer as the ferromagnetic layer closer to the wires that produce a current field. In addition, the soft ferromagnetic layer may be a two-layer film of soft ferromagnetic layer/ ferromagnetic layer or a three-layer film of ferromagnetic layer/soft ferromagnetic layer/ferromagnetic layer or of ferromagnetic layer/nonmagnetic layer/ferromagnetic layer which exhibits a ferromagnetic coupling in which antiferromagnetic interaction between the ferromagnetic layer is weak.

The tunnel barrier layer may be made of various types of dielectric, such as an oxide or nitride of Al, Si, Mg, Sr, Sr—Ti, or rare earth elements. Specifically, $Al_2O_3$, $SiO_2$, MgO, AlN, $Bi_2O_3$, $MgF_2$, $CaF_2$, $SrTiO_2$, and $AlLaO_3$ are preferable. These dielectrics may lack oxygen, nitrogen, or boron. It is desirable that the tunnel barrier should be thinner. Although the thickness of the tunnel barrier layer is preferably 10 nm or less from the viewpoint of manufacturing, there is no limit to the thickness.

Furthermore, an underlying layer may be provided on the bottom of the TMR element 20 and a protective layer be provided on its top. It is desirable that the material for the underlying layer or protective layer should be Ta, Ti, Pt, Pd, Au, Ti/Pt, Ta/Pt, Ti/Pd, Ta/Pd, Cu, or Al—Cu.

Each layer constituting the TMR element 20 can be formed by an ordinary film forming method, such as a sputtering method, evaporation method, or molecular beam epitaxial growth method.

The materials for the wires (word lines and bit lines) 18, 19, 22 and contact metals 16, 17 may be Al, Cu, or Al—Cu. It is desirable that a barrier metal made of W, Ta, Ti, Pt, Pd, Au, Ti/Pt, Ta/Pt, Ti/Pd, or Ta/Pd, or a nitride of Ta, Ti, Ti/Pt, Ta/Pt, Ti/Pd, Ta/Pd, Cu, or Al—Cu is provided between the contact metal 17 and the ferromagnetic tunnel junction 20.

A concrete structure of the ferromagnetic tunnel junction element (TMR element) 20 used in each of the first to third embodiments will be described by reference to FIGS. 10A to 10D.

Figure 10A:
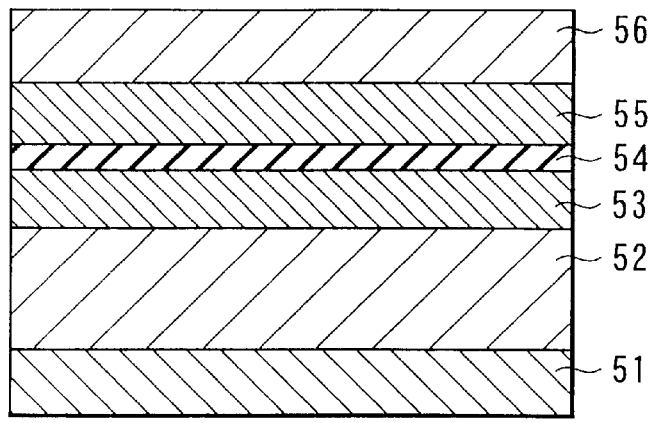
FIGS. 10A to 10D are sectional views schematically showing ferromagnetic tunnel junction elements used in each of the first to third embodiments, respectively.

A TMR element shown in FIG. 10A is a ferromagnetic single tunnel junction element. The ferromagnetic single tunnel junction element has a structure where a underlying layer 51, an antiferromagnetic layer 52, a first ferromagnetic layer (magnetization fixed layer) 53, a tunnel barrier layer 54, a second ferromagnetic layer (magnetic recording layer) 55, and a protective layer 56 are stacked one on top of another.

Figure 10B:
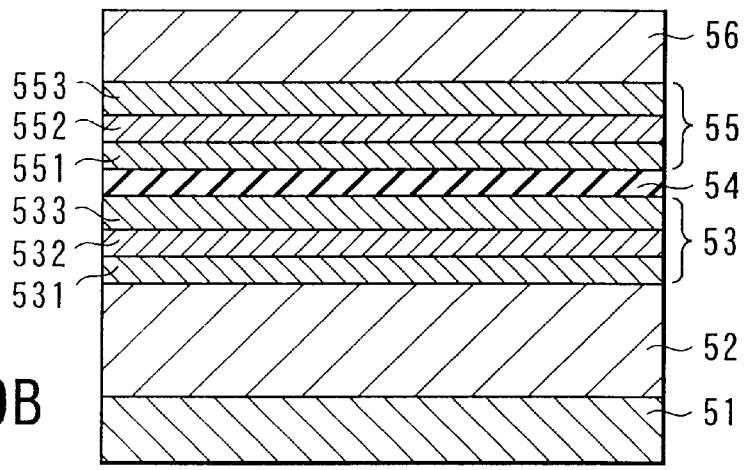

A TMR element shown in FIG. 10B is a ferromagnetic single tunnel junction element which is the same as that of FIG. 10A except that the first ferromagnetic layer (magnetization fixed layer) 53 is composed of a three-layer film of ferromagnetic layer 531/nonmagnetic layer 532/ ferromagnetic layer 533 and the second ferromagnetic layer (magnetic recording layer) 55 is composed of ferromagnetic layer 551/nonmagnetic layer 552/ferromagnetic layer 553.

Figure 10C:
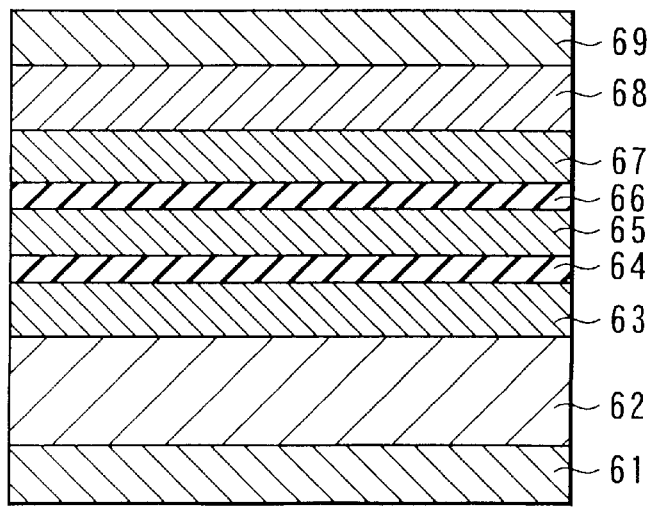

A TMR element shown in FIG. 10C is a ferromagnetic double tunnel junction element. The ferromagnetic double tunnel junction element has a structure where a underlying layer 61, an antiferromagnetic layer 62, a first ferromagnetic layer (magnetization fixed layer) 63, a tunnel barrier layer 64, a second ferromagnetic layer (magnetic recording layer) 65, a tunnel barrier layer 66, a third ferromagnetic layer (magnetic recording layer) 67, an antiferromagnetic layer 68, and a protective layer 69 are stacked one on top of another.

Figure 10D:
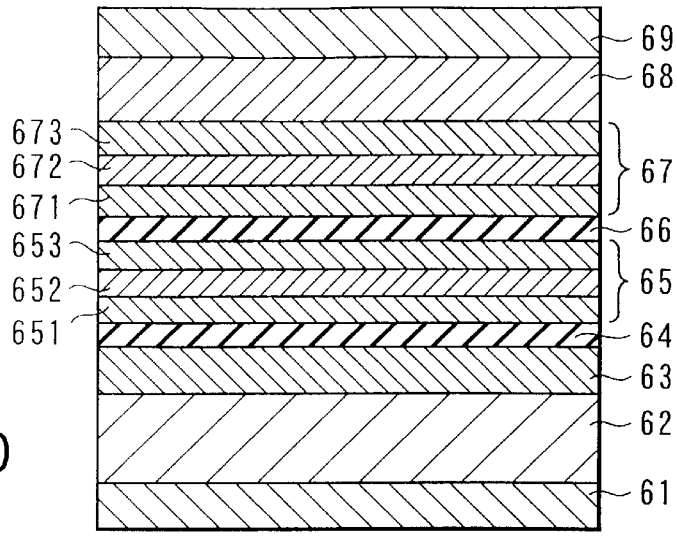

A TMR element shown in FIG. 10D is a ferromagnetic double tunnel junction element which is the same as that of FIG. 10C except that the second ferromagnetic layer (magnetic recording layer) 65 is composed of a three-layer film of ferromagnetic layer 651/nonmagnetic layer 652/ ferromagnetic layer 653 and the third ferromagnetic layer (magnetization fixed layer) 67 is composed of ferromagnetic layer 671/nonmagnetic layer 672/ferromagnetic layer 673.

When a ferromagnetic double tunnel junction element as shown in FIGS. 10C or 10D is used, a high signal voltage Vs is obtained because the dependence of the MR change rate on the bias voltage is small. In this case, it is desirable that the ratio L/W of the length L to width W of the magnetic recording layer should be 2 or more and that a uniaxial anisotropy should be given in the direction of length.

At this point, the S/N ratio of the magnetic memory according to the first to third embodiments, in a case where whether a cell retain an information "1" or an information "0" is judged by comparison with a voltage of the reference cell connected to the bit line as in a DRAM, will be examined. If the read current is $I_s$, the resistance of the TMR element is R, the MR change rate is MR, the resistance of the diode is r, and its variation is β, the output voltage $V_s$ is expressed as:

$$V_s = MR \times R \times I_s/2 - \beta \times r \times I_s.$$

Specifically, it is ½ of the change of the resistance caused by the MR effect that contributes to the signal voltage. In addition, variations in the diode characteristic act as noise, which lowers the signal voltage. This makes the S/N ratio of the MRAM using a ferromagnetic single tunnel junction as low as about 30 dB. For example, assuming that a variation in the ordinary diode characteristic is $\beta=0.2$, $r=1$ k$\Omega$, $I_s=10$ $\mu$A, $R=40$ k$\Omega$, and, MR=25% when a bias voltage of 400 mV is applied, it follows that $V_s=48$ mV and $\beta \times r \times I_s=2$ mV. In this case, the S/N ratio is $20 \times \log(48/2)=27.6$ dB. On the other hand, in an MRAM using a ferromagnetic double tunnel junction, when a bias voltage of 400 mV is applied, it follows that MR>32%. In this case, although the inequality S/N ratio>$20 \times \log(64/2)$>30 dB is satisfied, it is desirable that the S/N ratio should be improved more.

Figure 11:
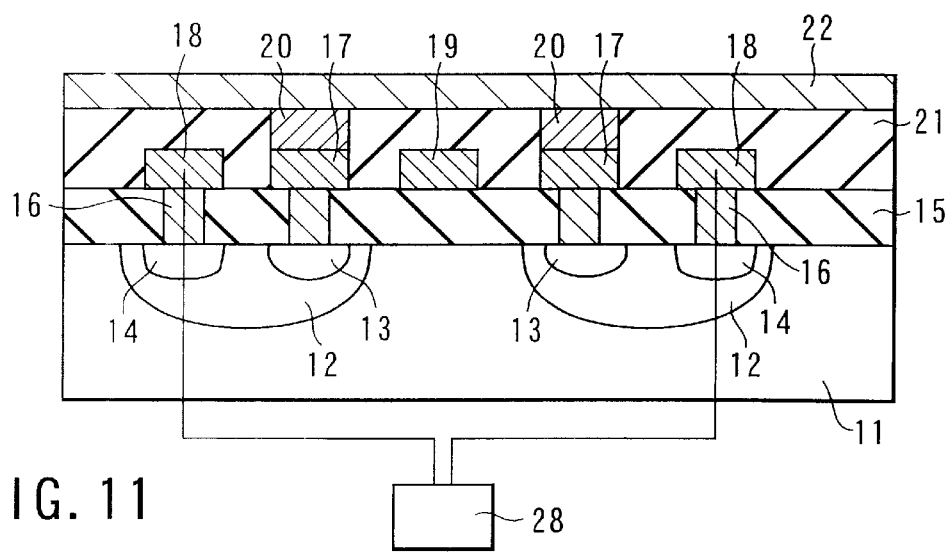
FIG. 11 is a sectional view schematically showing an example of providing the memory of FIG. 1 with a sensing circuit for performing differential sensing.

To improve the S/N ratio in a magnetic memory according to each of the first to third embodiments, it is desirable to perform differential amplification using two adjacent TMR elements 20 as shown in FIG. 11. In this method, writing is done in such a manner that the magnetization of one TMR element 20 is always in reverse parallel with the magnetization of the other TMR element 20 and the potential difference or load voltage difference between the two TMR elements 20 is sensed by a sensing circuit 28 connected to word lines 18 in a differential manner. Although the cell size of the MRAM with such an architecture is larger than that of the DRAM, it is smaller than that of an architecture that performs differential sensing using two transistors and two TMR elements (ISSCC 2000 International Meeting, February, 2000), which enables a higher packaging density.

Hereinafter, examples of the present invention will be explained.

EXAMPLE 1

A solid-state magnetic memory shown in FIG. 6 was manufactured by the method explained below. In this example, ferromagnetic double tunnel junction elements were formed as TMR elements 20.

First, an $Si_3N_4$ film was formed by vapor phase reaction on an SOI substrate where a p-type silicon layer 102 was formed on an insulating substrate 101. Then, after the $Si_3N_4$ film was patterned by RIE using a stepper, a trench insulating film 103 was formed by oxygen ion implantation or thermal oxidation using the $Si_3N_4$ pattern as a mask. By photolithography and ion implantation, an n-well 12 was formed in the surface region of the p-type silicon layer 102 of each of the memory cells isolated by the trench insulating layer 103 from one another. In each n-well 12, a p$^+$ diffused layer 13 and n$^+$ diffused layer 14 were formed. The p$^+$ diffused layer 13 and n-well 12 constituted a p-n junction diode.

Next, an insulating layer 15 of $SiO_2$ was formed all over the surface of the SOI substrate at which the p-n junction diodes were formed. On the insulating layer 15, an $Si_3N_4$ film was formed by vapor phase reaction. Thereafter, using photolithography and RIE, contact holes were made in the insulating layer 15 at the positions of the p$^+$ diffused layers 13 and n$^+$ diffused layers 14. After the contact holes were filled with Cu by sputtering techniques, the Cu located outside the contact holes were removed by CMP. In this way, contact metals 16 were formed.

Then, an $SiO_2$ film and an $Si_3N_4$ film were formed all over the surface of the SOI substrate at which the contact metals 16 were formed. In these films, grooves were made by photolithography and RIE in such a manner that they correspond to the contact holes and word lines 18, 19. After the contact holes and grooves were filled with barrier metal and Cu by sputtering techniques, the barrier metal and Cu outside the contact holes and grooves were removed by CMP. In this way, the contact metals 17 of the ferromagnetic tunnel junction elements, first word lines 18, and second word lines 19 were formed. The contact metal 17 was connected via the contact metal 16 to the p$^+$ diffused layer 13 constituting a diode. The first word line 18 and second word line 19 were formed so as to sandwich the contact metal between them. The first word line 18 was connected via the contact metal 16 and n$^+$ diffused layer 14 to the n-well 12 constituting the diode. The second word line 19 was insulated electrically from the diode.

Next, to form ferromagnetic double tunnel junction elements, a stacked film explained below was formed all over the surface. The stacked film was composed of a Ta underlying layer/Cu (15 nm)/$Ni_{81}F_{19}$ (2 nm)/$Ir_{22}Mn_{78}$ (12 nm)/$Co_{50}Fe_{50}$ (3 nm)/$Al_2O_3$ (1 nm)/$CO_{90}Fe_{10}$ (2 nm)/$Ni_{81}Fe_{19}$ (1 nm)/$Co_{90}Fe_{10}$ (2 nm)/$Al_2O_3$ (1 nm)/$CO_{50}Fe_{50}$ (3 nm)/$Ir_{22}Mn_{78}$ (12 nm)/Ta (5 nm)/Au protective layer. The initial degree of vacuum was set at $3 \times 10^{-8}$ Torr and these thin films were formed by sputtering techniques. The tunnel barrier layer of $Al_2O_3$ was formed by subjecting the Al target to sputtering in pure Ar gas to form an Al film, then introducing oxygen without ruining the vacuum, and thereby exposing the Al film to plasma oxygen. By this method, a thin $Al_2O_3$ tunnel barrier layer free of oxygen defects was formed. A Ti hard mask was formed on the stacked film thus formed. Then, photolithography and ion milling were performed, thereby forming ferromagnetic tunnel junction elements 20 of $1 \times 2$ $\mu m^2$ on the contact metals 17 in all the memory cells.

Then, a second insulating film (interlayer insulating film) 21 of $SiO_2$ was formed by plasma CVD. Thereafter, by performing CMP, the top surface of each ferromagnetic tunnel junction element 20 was exposed. A resist pattern for forming bit lines 22 was formed and then reverse sputtering was performed on the surface of the specimen to clean it. After Cu was deposited, the lift-off technique was used to form the bit lines 22. Finally, the obtained structure was heat-treated in a magnetic field, thereby introducing a uniaxial anisotropy to the magnetic recording layer and a unidirectional anisotropy to the magnetization fixed layer.

Current pulses of 10 nanoseconds were caused to flow to the magnetic memory produced by the aforementioned method as shown in FIGS. 3A to 3D and FIG. 4, thereby applying a current magnetic field to write the information. Thereafter, current was caused to flow as shown in FIG. 5 to read the written information. The result has shown that the information was written properly and that, when the information was written in a memory cell, the information written in the adjacent memory cells was not affected.

EXAMPLE 2

A solid-state magnetic memory shown in FIG. 1 was produced by the method explained below. In this case, ferromagnetic double tunnel junction elements were formed as TMR elements 20.

First, by photolithography and ion implantation, n-wells 12 were formed in the surface region of an Si monocrystalline substrate 11. In each n-well 12, a p$^+$ diffused layer 13 and n$^+$ diffused layer 14 were formed. The p$^+$ diffused layer 13 and n-well 12 constituted a p-n junction diode.

Next, an insulating layer 15 of $SiO_2$ was formed all over the surface of the substrate 11 at which the p-n junction diodes were formed. On the insulating layer 15, an $Si_3N_4$ film was formed by vapor phase reaction. Thereafter, using photolithography and RIE, contact holes were made in the insulating layer 15 at the positions of the p+ diffused layers 13 and n+ diffused layers 14. After the contact holes were filled with Cu by sputtering techniques, the Cu located outside the contact holes was removed by CMP. In this way, contact metals 16 were formed.

Then, an $SiO_2$ film and an $Si_3N_4$ film were formed all over the surface of the SOI substrate at which the contact metals 16 were formed. In these films, grooves were made by photolithography and RIE in such a manner that they correspond to the contact holes and word lines 18, 19. After the contact holes and grooves were filled with barrier metal and Cu, the barrier metal and Cu outside the contact holes and grooves were removed by CMP. In this way, the contact metals 17 of the ferromagnetic tunnel junction elements, first word line 18s, and second word lines 19 were formed. The contact metal 17 was connected via the contact metal 16 to the p+ diffused layer 13 constituting a diode. The first word line 18 and second word line 19 were formed so as to sandwich the contact metal between them. The first word line 18 was connected via the contact metal 16 and n+ diffused layer 14 to the n-well 12 constituting the diode. The second word line 19 was insulated electrically from the diode.

Next, to form ferromagnetic double tunnel junction elements, a stacked film explained below was formed all over the surface. The stacked film was composed of a Ta underlying layer/Pt (15 nm)/$Ni_{81}Fe_{19}$ (2 nm)/$Ir_{22}Mn_{78}$ (12 nm)/$Co_{80}Fe_{20}$ (3 nm)/$Al_2O_3$ (0.9 nm)/$Co_{90}Fe_{10}$ (2 nm)/Ru (1.4 nm)/$Co_{90}Fe_{10}$ (2 nm)/$Al_2O_3$ (0.9 nm)/$Co_{80}Fe_{20}$ (3 nm)/Ru (0.9 nm)/$Co_{90}Fe_{10}$ (2 nm)/$Ir_{22}Mn_{78}$ (12 nm)/Ta (5 nm)/Au protective layer. The initial degree of vacuum was set at $3 \times 10^{-8}$ Torr and these thin films were formed by sputtering techniques. The tunnel barrier layer of $Al_2O_3$ was formed by subjecting the Al target to sputtering in pure Ar gas to form an Al film, then introducing oxygen without ruining the vacuum, and thereby exposing the Al film to plasma oxygen. By this method, a thin $Al_2O_3$ tunnel barrier layer free of oxygen defects was formed. A Ti hard mask was formed on the stacked film thus formed. Then, photolithography and ion milling were performed, thereby forming ferromagnetic tunnel junction elements 20 of $1 \times 2$ $\mu m^2$ on the contact metals 17 in all the memory cells.

Then, a second insulating film (interlayer insulating film) 21 of $SiO_2$ was formed by plasma CVD. Thereafter, by performing CMP, the top surface of each ferromagnetic tunnel junction element 20 was exposed. A resist pattern for forming bit lines 22 was formed and then reverse sputtering was performed on the surface of the specimen to clean it. After Cu was deposited, the lift-off technique was used to form the bit lines 22. Finally, the obtained structure was heat-treated in a magnetic field, thereby introducing a uniaxial anisotropy to the magnetic recording layer and a unidirectional anisotropy to the magnetization fixed layer.

Current pulses of 10 nanoseconds were caused to flow to the magnetic memory produced by the aforementioned method as shown in FIGS. 3A to 3D and FIG. 4, thereby applying a current magnetic field to write the information. Thereafter, current was caused to flow as shown in FIG. 5 to read the written information. The result has shown that the information was written properly and that, when the information was written in a memory cell, the information written in the adjacent memory cells was not affected.

EXAMPLE 3

Figure 12:
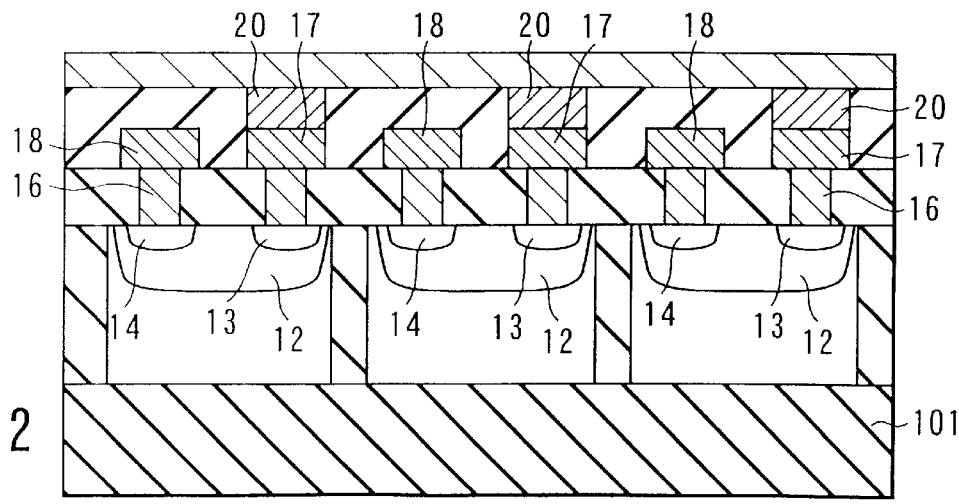
FIG. 12 is a sectional view schematically showing a solid-state magnetic memory according to an example 3 of the present invention.

FIG. 12 is a schematic sectional view of a solid-state magnetic memory according to a third example of the present invention. In this example, a solid-state magnetic memory shown in FIG. 12 was produced by the method explained below. In this case, ferromagnetic double tunnel junction elements were formed as TMR elements 20.

First, an $Si_3N_4$ film was formed on an SOI substrate where a p-type silicon layer 102 was formed on an insulating substrate 101. Next, after the $Si_3N_4$ film was patterned by RIE using a stepper, a trench insulating layer 103 was formed by oxygen ion implantation or thermal oxidation using the $Si_3N_4$ pattern as a mask. Using photolithography and ion implantation, an n-well 12 was formed in the surface region of a p-type silicon layer 102 of each of the memory cells isolated by the trench insulating layer 103 from each other. In each n-well 12, a p+ diffused layer 13 and n+ diffused layer 14 were formed. The p+ diffused layer 13 and n-well 12 constituted a p-n junction diode.

Next, an insulating layer 15 of $SiO_2$ was formed all over the surface of the SOI substrate at which the p-n junction diodes were formed. On the insulating layer 15, an $Si_3N_4$ film was formed by vapor phase reaction. Thereafter, using photolithography and RIE, contact holes were made in the insulating layer 15 at the positions of the p+ diffused layers 13 and n+ diffused layers 14. After the contact holes were filled with Cu by sputtering techniques, the Cu located outside the contact holes was removed by CMP. In this way, contact metals 16 were formed.

Then, an $SiO_2$ film and an $Si_3N_4$ film were formed all over the surface of the SOI substrate at which the contact metals 16 were formed. In these films, grooves were made by photolithography and RIE in such a manner that they correspond to the contact holes and word lines 18. After the contact holes and grooves were filled with barrier metal and Cu, the barrier metal and Cu outside the contact holes and grooves were removed by CMP. In this way, the contact metals 17 of the ferromagnetic tunnel junction elements and word lines 18 were formed. The contact metal 17 was connected via the contact metal 16 to the p+ diffused layer 13 constituting a diode. The adjacent word lines 18 were formed so as to sandwich the contact metal between them. The word line 18 was connected via the contact metal 16 and n+ diffused layer 14 to the n-well 12 constituting the diode.

Next, to form ferromagnetic double tunnel junction elements, a stacked film explained below was formed all over the surface. The stacked film was composed of a Ta underlying layer/Cu (15 nm)/$Ni_{81}Fe_{19}$ (2 nm)/$Ir_{22}Mn_{78}$ (7 nm)/$Co_{50}Fe_{50}$ (3 nm)/$Al_2O_3$ (1 nm)/$Co_{90}Fe_{10}$ (2 nm)/$Ni_{81}Fe_{19}$ (1 nm)/$Co_{90}Fe_{10}$ (2 nm)/$Al_2O_3$ (1 nm)/$Co_{50}Fe_{50}$ (3 nm)/$Ir_{22}Mn_{78}$ (7 nm)/Ta (5 nm)/Au protective layer. The initial degree of vacuum was set at $3 \times 10^{-8}$ Torr and these thin films were formed by sputtering techniques. The tunnel barrier layer of $Al_2O_3$ was formed by subjecting the Al target to sputtering in pure Ar gas to form an Al film, then introducing oxygen without ruining the vacuum, and thereby exposing the Al film to plasma oxygen. By this method, a thin $Al_2O_3$ tunnel barrier layer free of oxygen defects was formed. A Ti hard mask was formed on the stacked film thus formed. Then, photolithography and ion milling were performed, thereby forming ferromagnetic tunnel junction elements 20 of $1 \times 2$ $\mu m^2$ on the contact metal 17 in all the memory cells.

Then, a second insulating film (interlayer insulating film) 21 of $SiO_2$ was formed by plasma CVD. Thereafter, by performing CMP, the top surface of each ferromagnetic tunnel junction element 20 was exposed. A resist pattern for forming bit lines 22 was formed and then reverse sputtering was performed on the surface of the specimen to clean it.

After Cu was deposited, the lift-off technique was used to form the bit lines 22. Finally, the obtained structure was heat-treated in a magnetic field, thereby introducing a uniaxial anisotropy to the magnetic recording layer and a unidirectional anisotropy to the magnetization fixed layer.

Current pulses of 10 nanoseconds were caused to flow to the magnetic memory produced by the aforementioned method as shown in FIGS. 3A to 3D and FIG. 4, thereby applying a current magnetic field to write the information. Thereafter, current was caused to flow as shown in FIG. 5 to read the written information. The result has shown that the information was written properly and that, when the information was written in a memory cell, the information written in the adjacent memory cells was not affected.

As described above in detail, since the present invention uses diodes, it is not at a disadvantage in that its capacity is determined by the size of transistors. Therefore, the invention enables a higher packing density than that of DRAMs. Furthermore, in the invention, since at least part of each diode is formed in the surface region of the semiconductor substrate, there is almost no possibility that a leak path will occur at the diode, which is different from a case where the diodes are formed on the wires. Consequently, according to the present invention, there is provided a solid-state magnetic memory which enables a larger capacity, assures a high reliability, and has a high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state magnetic memory comprising:
   a semiconductor substrate,
   ferromagnetic tunnel junction elements arrayed in a row direction and a column direction crossing the row direction and each comprising,
      a magnetic recording layer, a magnetization direction of which can be reversed by applying first and second magnetic fields thereto,
      a magnetization fixed layer facing the magnetic recording layer and configured to retain a magnetization direction thereof unchanged on applying the first and second magnetic fields, and
      a nonmagnetic layer intervening between the magnetic recording layer and the magnetization fixed layer;
   first wirings each extending in the column direction and arranged in the row direction, a unit consisting of one of the first wirings and one of first element groups being repeated in the row direction, and each of the first element groups comprising part of the ferromagnetic tunnel junction elements arranged in the column direction;
   second wirings positioned apart from the first wirings, each extending in the row direction and arranged in the column direction, the second wirings facing second element groups respectively, and each of the second element groups comprising part of the ferromagnetic tunnel junction elements arranged in the row direction; and
   diodes each formed in a surface region of the semiconductor substrate at least partially, each of the second wirings being electrically connected to one of the first wirings via one of the ferromagnetic tunnel junction elements and one of the diodes, wherein the memory is configured to generate the first magnetic field by causing currents to flow in the same direction through two of the first wirings adjacent to each other and to generate the second magnetic field by causing a current to flow through one of the second wirings on writing information in one of the ferromagnetic tunnel junction elements that is closest to the two of the first wirings adjacent to each other and closest to the one of the second wirings.

2. The solid-state magnetic memory according to claim 1, wherein each of the diodes is a p-n junction diode comprising a p-type region and an n-type region both formed in the surface region of the substrate.

3. The solid-state magnetic memory according to claim 1, wherein the first wirings are located between the diodes and the second wirings, and the magnetic recording layers are located between the first wirings and the second wirings.

4. The solid-state magnetic memory according to claim 1, wherein the semiconductor substrate is either a monocrystalline silicon substrate or an SOI substrate.

5. The solid-state magnetic memory according to claim 1, wherein the semiconductor substrate comprises a trench insulating layer therein, the trench insulating layer electrically insulating the diodes from each other.

6. The solid-state magnetic memory according to claim 1, further comprising a sensing circuit configured to differentially sense either a potential difference or a load voltage between two of the ferromagnetic tunnel junction elements.

7. A solid-state magnetic memory comprising:
   a semiconductor substrate;
   ferromagnetic tunnel junction elements arrayed in a row direction and a column direction crossing the row direction and each comprising,
      a magnetic recording layer, a magnetization direction of which can be reversed by applying first and second magnetic fields thereto,
      a magnetization fixed layer facing the magnetic recording layer and configured to retain a magnetization direction thereof unchanged on applying the first and second magnetic fields, and
      a nonmagnetic layer intervening between the magnetic recording layer and the magnetization fixed layer;
   first and second wirings each extending in the column direction and arranged in the row direction, a unit consisting of two of the first wirings, two of first element groups positioned between the two of the first wirings, and one of the second wirings positioned between the two of the first element groups being repeated in the row direction, each of the first element groups comprising part of the ferromagnetic tunnel junction elements arranged in the column direction, and the first and second wirings being configured to generate the first magnetic field by causing currents to flow in the same direction through one of the first wirings and one of the second wirings adjacent to each other;
   third wirings positioned apart from the first and second wirings, each extending in the row direction and arranged in the column direction, the third wirings facing second element groups respectively, each of the second element groups comprising part of the ferromagnetic tunnel junction elements arranged in the row direction, and the third wirings being configured to generate the second magnetic field by causing a current to flow one of the third wirings; and
   diodes each formed in a surface region of the semiconductor substrate at least partially, each of the third wirings being electrically connected to one of the first wirings via one of the ferromagnetic tunnel junction elements and one of the diodes, and the second wirings being electrically insulated from the first and third wirings.

8. The solid-state magnetic memory according to claim 7, wherein each of the diodes is a p-n junction diode comprising a p-type region and an n-type region both formed in the surface region of the substrate.

9. The solid-state magnetic memory according to claim 7, wherein the first wiring wirings are located between the diodes and the second wirings, and the magnetic recording layers are located between the first and second wirings and the third wirings.

10. The solid-state magnetic memory according to claim 7, wherein the semiconductor substrate is either a monocrystalline silicon substrate or an SOI substrate.

11. The solid-state magnetic memory according to claim 7, wherein the semiconductor substrate comprises a trench insulating layer therein, the trench insulating layer electrically insulating the diodes from each other.

12. The solid-state magnetic memory according to claim 7, further comprising a sensing circuit configured to differentially sense either a potential difference or a load voltage between two of the ferromagnetic tunnel junction elements.

13. A solid-state magnetic memory comprising:
   a semiconductor substrate,
   a ferromagnetic tunnel junction element facing the semiconductor substrate and comprising,
      a magnetic recording layer, a magnetization direction of which can be reversed by applying first and second magnetic fields thereto,
      a magnetization fixed layer facing the magnetic recording layer and configured to retain a magnetization direction thereof unchanged on applying the first and second magnetic fields, and
      a nonmagnetic layer intervening between the magnetic recording layer and the magnetization fixed layer;
   a first wiring and a second wiring, the first and second wirings sandwiching the ferromagnetic tunnel junction element from both sides thereof;
   a third wiring positioned apart from the first arid second wirings, extending in the row direction and facing the ferromagnetic tunnel junction element; and
   a diode formed in a surface region of the semiconductor substrate at least partially, the third wiring being electrically connected to the first wiring via the ferromagnetic tunnel junction element and the diode, wherein the memory is configured to generate the first magnetic field by causing currents to flow in the same direction through the first and second wirings and to generate the second magnetic field by causing a current to flow through the third wiring on writing information in the ferromagnetic tunnel junction element.

14. The solid-state magnetic memory according to claim 13, wherein diode is a p-n junction diode comprising a p-type region and an n-type region both formed in the surface region of the substrate.

15. The solid-state magnetic memory according to claim 14, wherein the ferromagnetic tunnel junction element faces the p-type region.

16. The solid-state magnetic memory according to claim 14, wherein the first wiring faces the n-type region.

17. The solid-state magnetic memory according to claim 13, wherein the first wiring is located between the diode and the third wiring, and the magnetic recording layer is located between the first and second wirings and the third wiring.

18. The solid-state magnetic memory according to claim 13, wherein the semiconductor substrate is either a monocrystalline silicon substrate or an SOI substrate.

19. A solid-state magnetic memory comprising:
   ferromagnetic tunnel junction elements arrayed in a row direction and a column direction crossing the row direction and each comprising,
      a magnetic recording layer, a magnetization direction of which can be reversed by applying first and second magnetic fields thereto,
      a magnetization fixed layer facing the magnetic recording layer and configured to retain a magnetization direction thereof unchanged on applying the first and second magnetic fields, and
      a nonmagnetic layer intervening between the magnetic recording layer and the magnetization fixed layer;
   first wirings each extending in the column direction and arranged in the row direction, a unit consisting of one of the first wirings and one of first element groups being repeated in the row direction, and each of the first element groups comprising part of the ferromagnetic tunnel junction elements arranged in the column direction; and
   second wirings positioned apart from the first wirings, each extending in the row direction and arranged in the column direction, the second wirings facing second element groups respectively, and each of the second element groups comprising part of the ferromagnetic tunnel junction elements arranged in the row direction, wherein the memory is configured to generate the first magnetic field by causing currents to flow in the same direction through two of the first wirings adjacent to each other and to generate the second magnetic field by causing a current to flow through one of the second wirings on writing information in one of the ferromagnetic tunnel junction elements that is closest to the two of the first wirings adjacent to each other and closest to the one of the second wirings.

20. A solid-state magnetic memory comprising:
   ferromagnetic tunnel junction elements arrayed in a row direction and a column direction crossing the row direction and each comprising,
      a magnetic recording layer, a magnetization direction of which can be reversed by applying first and second magnetic fields thereto,
      a magnetization fixed layer facing the magnetic recording layer and configured to retain a magnetization direction thereof unchanged on applying the first and second magnetic fields, and
      a nonmagnetic layer intervening between the magnetic recording layer and the magnetization fixed layer;
   first and second wirings each extending in the column direction and arranged in the row direction, a unit consisting of two of the first wirings, two of first element groups positioned between the two of the first wirings, and one of the second wirings positioned between the two of the first element groups being repeated in the row direction, and each of the first element groups comprising part of the ferromagnetic tunnel junction elements arranged in the column direction; and
   third wirings positioned apart from the first and second wirings, each extending in the row direction and arranged in the column direction, the third wirings facing second element groups respectively, and each of the second element groups comprising part of the ferromagnetic tunnel junction elements arranged in the row direction, wherein the memory is configured to generate the first magnetic field by causing currents to flow in the same direction through one of the first wirings and one of the second wirings adjacent to each other and to generate the second magnetic field by causing a current to flow through one of the third wirings on writing information in one of the ferromagnetic tunnel junction elements that is closest to the one of the first wirings and the one of the second wirings adjacent to each other and closest to the one of the third wirings.

21. A solid-state magnetic memory comprising:

a ferromagnetic tunnel junction element facing the semiconductor substrate and comprising,
- a magnetic recording layer, a magnetization direction of which can be reversed by applying first and second magnetic fields thereto,
- a magnetization fixed layer facing the magnetic recording layer and configured to retain a magnetization direction thereof unchanged on applying the first and second magnetic fields, and
- a nonmagnetic layer intervening between the magnetic recording layer and the magnetization fixed layer;

a first wiring and a second wiring, the first and second wirings sandwiching the ferromagnetic tunnel junction element from both sides thereof, and a third wiring positioned apart from the first and second wirings, extending in the row direction and facing the ferromagnetic tunnel junction element, wherein the memory is configured to generate the first magnetic field by causing currents to flow in the same direction through the first and second wirings and to generate the second magnetic field by causing a current to flow through the third wiring on writing information in the ferromagnetic tunnel junction element.

* * * * *